United States Patent [19]

McQuade et al.

[11] Patent Number: 5,416,429
[45] Date of Patent: May 16, 1995

[54] PROBE ASSEMBLY FOR TESTING INTEGRATED CIRCUITS

[75] Inventors: Francis T. McQuade, Watertown; Jack Lander, Danbury, both of Conn.

[73] Assignee: Wentworth Laboratories, Inc., Brookfield, Conn.

[21] Appl. No.: 247,874

[22] Filed: May 23, 1994

[51] Int. Cl.6 .............................................. G01R 1/04
[52] U.S. Cl. ..................... 324/762; 324/754; 324/758; 324/72.5
[58] Field of Search ............ 324/754, 158 F, 762, 324/754, 158.1, 757, 758, 72.5

[56] References Cited

U.S. PATENT DOCUMENTS

| | | | |
|---|---|---|---|
| 3,867,698 | 2/1975 | Beltz et al. | 324/158 P |
| 3,891,924 | 6/1975 | Ardezzone | 324/762 |
| 4,574,235 | 3/1986 | Kelly | 324/158 F |
| 4,719,417 | 1/1988 | Evans | 324/158 P |
| 4,899,099 | 2/1990 | Mendenhall et al. | 324/158 P |
| 4,975,638 | 12/1990 | Evans et al. | 324/158 P |
| 5,041,782 | 8/1991 | Marzan | 324/158 F |
| 5,059,898 | 10/1991 | Barsotti | 324/762 |
| 5,066,907 | 11/1991 | Tarzweil et al. | 324/158 P |
| 5,084,672 | 1/1992 | Ikeushi et al. | 324/158 P |
| 5,128,612 | 7/1992 | Aton | 324/754 |
| 5,148,103 | 9/1992 | Pasiecznik, Jr. | 324/158 P |
| 5,156,649 | 10/1992 | Compton et al. | 324/158 P |
| 5,214,375 | 5/1993 | Ikeuchi | 324/754 |
| 5,221,895 | 6/1993 | Janko | 324/158 P |
| 5,307,012 | 4/1994 | Bhattacharyya et al. | 324/158 P |

*Primary Examiner*—Kenneth A. Wieder
*Assistant Examiner*—Mark A. Wardas
*Attorney, Agent, or Firm*—William C. Crutcher

[57] ABSTRACT

A probe assembly for testing an integrated circuit includes a probe card of insulating material with a central opening, a rectangular frame with a smaller opening attached to the probe card, four separate probe wings each comprising a flexible laminated member having a conductive ground plane sheet, an adhesive dielectric film adhered to the ground plane, and probe wing traces of spring alloy copper on the dielectric film. Each probe wing has a cantilevered leaf spring portion extending into the central opening and terminates in a group of aligned individual probe fingers provided by respective terminating ends of said probe wing traces. The probe fingers have tips disposed substantially along a straight line and are spaced to correspond to the spacing of respective contact pads along the edge of an IC being tested. Four spring clamps each have a cantilevered portion which contact the leaf spring portion of a respective probe wing, so as to provide an adjustable restraint for one of the leaf spring portions. There are four separate spring clamp adjusting means for separately adjusting the pressure restraints exercised by each of the spring clamps on its respective probe wing. The separate spring clamp adjusting means comprise spring biased platforms each attached to the frame member by three screws and spring washers so that the spring clamps may be moved and oriented in any desired direction to achieve adjustment of the position of the probe finger tips on each probe wing.

15 Claims, 4 Drawing Sheets

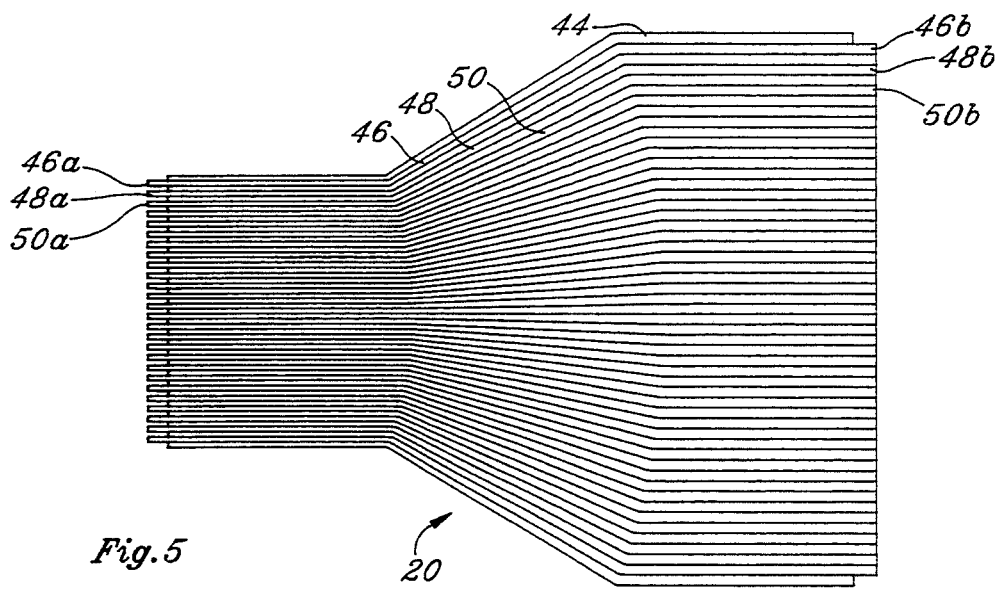
*Fig.5*
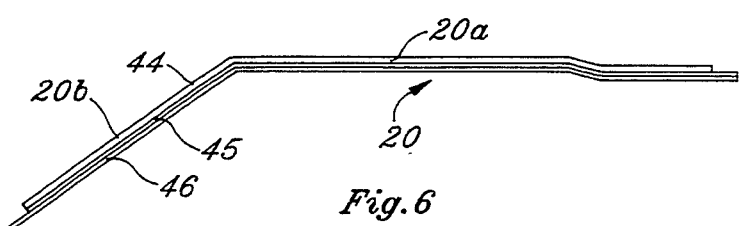
*Fig.6*
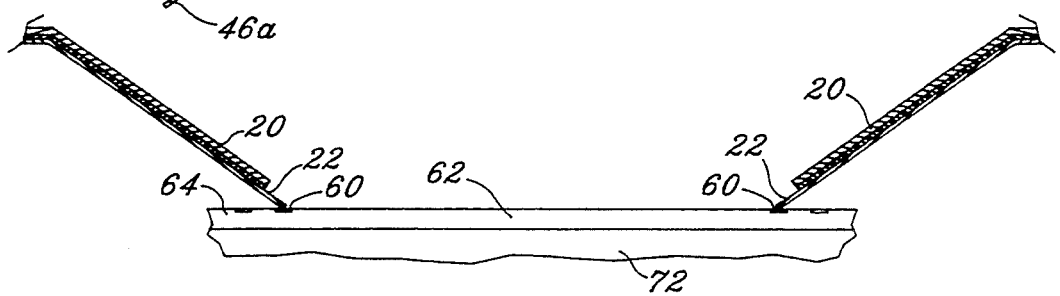
*Fig.7*
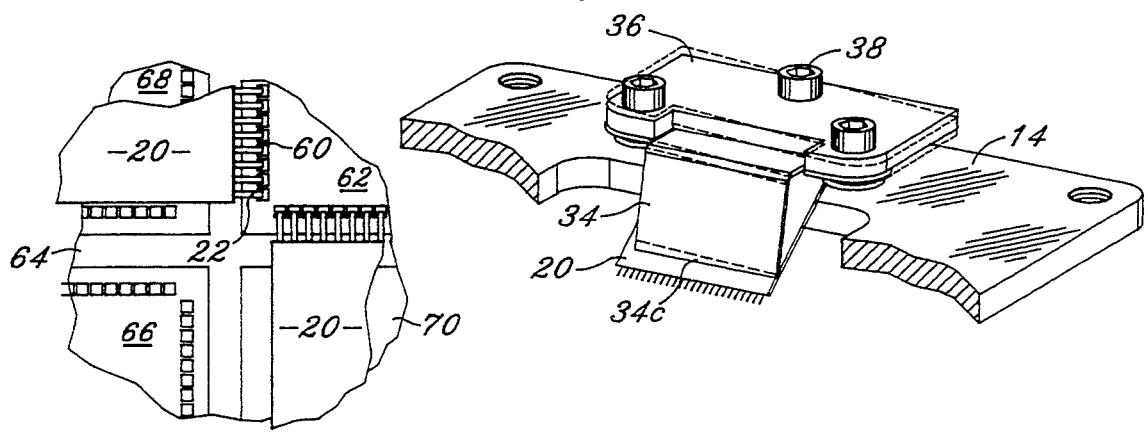
*Fig.8*
*Fig.9*

PROBE ASSEMBLY FOR TESTING INTEGRATED CIRCUITS

BACKGROUND OF INVENTION

1. Field of Invention

This invention relates generally to probe assemblies for testing integrated circuit (IC) devices whose contact pads are deployed in a predetermined pattern around the IC periphery in a common plane, and more particularly to an assembly of this type which includes a probe card with test terminals connectable to a plurality of probe fingers arranged in a matching pattern in the form of spring contact fingers, whereby when an IC device to be tested is raised to bring its contact pads into engagement with the spring fingers, this action causes the fingers to flex upwardly and inwardly, and in doing so to scrub the contact pads and thereby ensure effective electrical contact therewith, so that the IC may be tested while still on the silicon wafer.

2. Status of Prior Art

Many complex electronic circuits previously regarded as economically unfeasible and impractical are now realizable in integrated circuit (IC) form. The fabrication of a single-crystal monolithic circuit involves the formation of diodes, transistors, resistors and capacitors on a single microelectronic substrate formed on a silicon wafer. The circuits are applied to the wafer by photolithography, each wafer containing an array of identical integrated sections. The wafer is then sliced into "dice," so that each die or chip carries a single integrated circuit. In a typical IC chip, input and output terminals, power supply and other circuit terminals are created by metallized contact pads, usually deployed along the margins of the chip. The geometry of the chip is either square or rectangular, and the marginal locations of the contact pads thereon depend on the circuit configuration and the available marginal space, usually being laid out in a line of uniformly spaced pads along each edge of the chip.

In order to ensure that the various circuits in each IC chip are functioning properly, so that the chip will operate reliably in the electronic apparatus in which it is included, one must test the chip before it is installed. The packaging of an IC chip is relatively costly and time consuming, and because a significant number of IC chips fail the test and have to be discarded, it is desirable that each chip be tested before being placed in its package.

An early test probe for testing semiconductor devices such as beam-leaded transistors or integrated circuit chips is shown in U.S. Pat. No. 3,867,698, in which sets of converging test probe leads are embedded in the lower surface of a square annular frame of thermo plastic material. The inner ends of the leads extend in cantilevered fashion into a central opening, to terminate in flat and smooth tips which were pressed against the leads projecting from the integrated circuit ship. While such a test probe was suitable for beam leaded or packaged IC's, it is not suitable for testing circuits in situ on the silicon wafer before slicing into dice. For this, a needle test probe card evolved.

An unpackaged IC chip having no pins or leads can be electrically connected to IC chip-testing instrumentation by means of a needle-type test probe card, one well known form of which is disclosed in Evans U.S Pat. No. 4,382,228. The Evans card includes an opening providing access to the IC chip being tested, the opening being surrounded by a ring of spaced conductive platforms on which are anchored blade-like needle holders. Extending from each holder is a deflectable needle to engage a respective contact pad on the IC chip being tested.

In a subsequent Evans U.S. Pat. No. 4,719,417, the test probe card is provided with double-bent needles such that when the IC chip to be tested is raised upwardly to cause its contact pads to engage the tips of the needles, further upward movement of the chip, known as "overdrive", gives rise to lateral displacement of the tips along the surfaces of the contact pads. This results in a scrubbing action serving to break through any oxide film formed on the pads that would otherwise interfere with effective electrical contact.

Although needle probe cards have served the IC industry well for many years, they suffer two principle limitations: First, the pitch of the contact pads in present day IC's is very small, typically 0.005 to 0.004 inches, and approaching 0.003 in the foreseeable future. This minuscule spacing causes severe crowding of manually assembled and adjusted needles, and consequent electrical shorting and difficulties in repairing. Secondly, the higher operating frequencies of present day IC's demands a "ground plane" which extends as closely as possible to the point of contact between the needles and the IC pads, a feature absent in needle probe cards. The ground plane provides the probe array with a characteristic impedance which matches the impedance of the integrated circuit test apparatus. Future operating frequencies will be higher still, and thus make needle probe cards increasingly unsatisfactory.

In order to provide a test probe card suitable for IC chips having a high density of contact pads, Gangroth et al, U.S. Pat. No. 4,649,339, makes use of a flexible dielectric film having a sheet of copper laminated thereto that is etched to define conductive leads or traces which terminate in probe contacts. These probe contacts are patterned to engage the contact pads of high density VLSI or other integrated circuits. To bring about engagement between the probe contacts on the flexible film membrane and the contact pads on the IC chip, the film is arranged as a diaphragm covering an air chamber. When pressurized air is supplied to this chamber, the film is then flexed outwardly to conform to the surface of the IC chip. The practical difficulty with this arrangement is that the bulging film fails to scrub. Moreover, users generally object to having any part of the device other than the probe contacts making physical contact with the wafer under test.

An alternate to the needle probe cards with the scrubbing action provided by probe needles, is the use of so-called "bump technology", using contact pressure alone to effect good electrical contact throughout the oxide film. Rath U.S. Pat. No. 4,758,785 discloses a motorized lift system for raising an integrated circuit device upwardly against the probe contacts on a flexible film, above which is a resilient pressure pad of silicone-rubber. The practical difficulty with this arrangement is that the rubber pressure pad does not reliably ensure planarization and/or scrub of the probe contacts, and without such planarization and scrub, proper testing cannot be effected.

It must be borne in mind that when an IC wafer whose contact pads lie in a common plane is raised by a lifting mechanism toward a probe test card in which the probe contacts are formed on a flexible film, the wafer may then be caused to assume a slight angle relative to the plane of the film. As a consequence, contact pressure between the probe contacts and the contact pads will not be uniform, and this may militate against effective testing of the device.

To provide a high-density test probe assembly capable of accurately testing an IC device having a multiplicity of contact pads deployed in a common plane, Evans et al U.S. Pat. No. 4,975,638 discloses an assembly having a membrane formed by a flexible film of dielectric material, the membrane including a square contactor zone from whose corners extend radial slots to define suspension quadrants. Probe contacts are formed in a matching pattern on the face of the contactor zone. The suspension quadrants are supported at their ends on corresponding branches of a mounting frame, while the integral contactor zone sags below the frame which surrounds a central port in a printed circuit board, the port exposing the contactor zone to the IC device to be tested.

In the Evans et al '638 assembly, the probe contacts or bumps formed on the face of the contactor zone are connected to conductive traces running along the suspension wings. Since the assembly is put to repeated use, the probe bumps are eventually worn down. Also, they may lack adequate salience. Because the dielectric film on which the bumps are formed may be imperfect and exhibit minor projections, salience is necessary to raise the bumps above these projections.

We have also found, however, that contact bumps formed on the face of the contactor zone, even if given greater salience, tend to collect debris in the course of testing procedures. Moreover, compliance of the individual bumps is inadequate. Any seemingly minor or ordinary difference in adjacent bump heights require forces that are unacceptably high in order to obtain good mechanical contact on the recessive bumps by reason of insufficient elasticity in the membrane carrying the bumps.

We have also found that scrub is unreliable when limited to one direction, which is the case with devices having contact bumps formed on the face of the contactor zone. Such scrub may be achieved by various means, for example, by a cantilevered mounting arm angled downward that produces a slight lateral unidirectional excursion of the entire bump pattern when overdrive results in vertical excursion of the probe assembly. The net resulting lateral movement depends on the friction between the bumps and the pads on the device under test, and the bearing play found in the chuck of the testing machine. Such bearing play may range from virtually zero to dimensions that match or exceed the desired length of scrub. In the latter case, no scrub is produced.

Efforts to achieve the desirable scrubbing action of prior art test probe cards with flexible needles, as disclosed in the aforementioned earlier Evans U.S. Pat. Nos. 4,382,228 and 4,719,417, while also achieving the advantage of photolithographic techniques to produce the needles, led to development of a probe assembly which included a film membrane in which spring contact fingers were formed as extensions of traces running along the membrane. Cantilevered spring fingers were obtained by processing a multi-ply laminate having a copper ply serving as the ground plane, laminated with an adhesive layer to a dielectric of polyimide in turn laminated to a thin sheet of spring alloy copper. The lattermost ply was etched to define spring fingers and traces integral therewith and the spring fingers subsequently bent to obtain sharp contact fingers supported on the laminated membrane. This probe assembly and technique are disclosed in a co-pending application entitled "Probe Assembly for Testing Integrated Circuit Devices" in the names of Arthur Evans, Joseph R. Baker, and Jack Lander Ser. No. 08/001759 filed Jan. 7, 1993, and assigned to the present assignee.

The aforementioned pending application describes an improved probe assembly adapted to test an integrated circuit (IC) device whose contact pads are deployed in a predetermined pattern in a common plane. The assembly includes a film membrane having a planar dielectric contactor zone and an array of suspension quadrants radiating from this zone in a manner similar to Evans et al U.S. Pat. No. 4,975,638. The wings are clamped at their ends by a mounting ring surrounding a port in a printed circuit board which exposes the contactor zone suspended below the board to the IC device to be tested, the ring being secured to the board. Deployed in a matching pattern on the exposed face of the contactor zone and cantilevered therefrom to assume an angle with respect thereto are spring contact fingers that are extensions of traces running along the wings of the membrane to leads on the printed circuit board. These leads extend to respective test terminals on the board which are connectable to electronic instrumentation for conducting tests on the IC device. When the IC device is raised to bring its contact pads into engagement with the spring fingers, this action causes the fingers to flex inwardly and upwardly, and in doing so to scrub the contact pads and thereby ensure effective electrical contact.

While the aforementioned device achieves good scrub action, the test membrane is expensive to produce, delicate to handle, and experiences difficulty in achieving planarity. Because of the requirement to bend the spring alloy copper fingers after attachment and etching, it is difficult to attain uniform bending so that the finger tips are aligned. It is desirable to have all finger tips planar within 0.001 inches. When co-planarity of the finger tips must be achieved on all four edges of the contact zone of the membrane, uniform contact with the integrated circuit pads is difficult to achieve.

Also since the fingers are formed by bending, fatigue life becomes a factor in the life of the test probe membrane. Fatigue life could be dramatically improved by providing a finger assembly formed by photolithography and etching techniques, which does not require bending the etched trace extensions.

And also, because the ratio of finger thickness, width, and pitch is limited by photolithographic manufacturing processes, and these limits, in turn, dictate a finger length that results in adequate spring force, the compromised balance of resulting spring fatigue life and electrical performance generally does not provide a number of test cycles that is economic.

Although all of the contact pads are co-planar on the integrated circuit, it will be appreciated that the contact pads are usually arranged in straight lines and disposed on the four peripheral edges of the integrated circuit. A simplified test probe assembly with improved means to separately adjust the probe finger tips with respect to each separate line of pads, where they are arranged in linear sets of spaced contact pads on the IC periphery, would be desirable.

Accordingly, one object of the present invention is to provide an improved probe assembly for testing integrated circuits while on the silicon wafer before further processing and separating the dies or chips.

Another object of the invention is to provide an improved test probe assembly for connecting respective test probe fingers to closely spaced, linear sets of co-planar IC contact pads with good scrub action.

Another object of the invention is to provide an improved test probe assembly utilizing probe finger arrays formed by photolithography and etching techniques and having good fatigue life.

Still another object of the invention is to provide an improved adjustment device for achieving adjustment of a line of probe fingers supported on a flexible laminated member.

Another object of the invention is to provide an arrangement for obtaining precise alignment of probe fingers through the use of independent leaf springs each supporting multiple probe fingers.

Still another object of the invention is to provide improved probe arrays having a ground plane providing a characteristic impedance that matches the impedance of the integrated circuit test apparatus.

SUMMARY OF THE INVENTION

Briefly stated, the invention comprises a probe assembly for testing an integrated circuit having linear sets of spaced substantially co-planar contact pads disposed thereon, comprising a probe card of insulating material having spaced probe card traces for making temporary test connections with integrated circuit test apparatus, at least one probe wing comprising a flexible laminated member comprising a ground plane sheet of electrically conductive material, a dielectric film of substantially uniform thickness adhered thereto, and a plurality of electrically separate probe wing traces disposed on the other side of said dielectric film from said ground plane, said probe wing including a support portion wherein probe wing traces are spaced for contacting respective probe card traces. The probe wing includes a leaf spring portion wherein the probe wing traces extend beyond the dielectric film to terminate in a plurality of probe fingers having tips disposed along a straight line and spaced to correspond to the spacing of the contact pads in a linear set on the IC, means for attaching the support portion of the probe wing to the probe card, and adjustable means for restraining the leaf spring portion.

In a preferred form of the invention, the probe card defines a central opening larger than the integrated circuit with linear ends of the probe card traces terminating around the central opening and having opposite outer ends connected to test terminals thereon for making temporary test connections with the integrated circuit test apparatus. An annular frame member is removably attached to said probe card adjacent the opening, and there are four probe wings, each comprising a flexible laminated member having an electrically conductive ground plane and electrically conductive probe wing traces insulated from the ground plane by a dielectric film ply. Each probe wing has a leaf spring portion which extends into the central opening with the linear sets of probe fingers arranged in orthogonal relationship so as to enable simultaneous registration with four linear sets of contact pads on the periphery of an integrated circuit. Four spring clamps, each having an adjustable support portion disposed on the frame member and having a cantilevered portion terminating in a straight edge contacts the leaf spring portion of a respective probe wing, so as to provide an adjustable restraint for one of the leaf spring portions. Separate spring clamp adjusting means are provided for separately adjusting the pressure restraints exercised by each of the spring clamps on its respective probe wing. In the preferred embodiment, the separate spring clamp adjusting means comprises spring biased platforms each attached to the frame member by three screws and spring washers so that the contact edges of the spring clamps may be moved and oriented in any desired direction to achieve adjustment of the position of the probe finger tips on each probe wing.

DRAWING

The above objects and the invention will best be illustrated by the following description, taken in connection with the accompanying drawings, in which FIG. 1 is an exploded perspective view of the test probe assembly illustrating the major components, FIG. 2 is a top plan view of the test probe assembly of FIG. 1, FIG. 3 is a cross sectional elevation view of the test probe assembly of FIG. 2, taken along lines III—III of FIG. 2, FIG. 4 is an enlarged cross sectional elevation view of the right hand side of FIG. 3, FIGS. 5 and 6 are bottom plan view and side elevational view respectively of one of the four probe wings used in the test probe assembly, FIG. 7 is a schematic cross sectional elevation view illustrating the operation of the invention in connection with testing integrated circuits on a silicon wafer, FIG. 8 is a schematic plan view illustrating partial elements of wing probes and integrated circuits on a silicon wafer during the testing process, FIG. 9 is a schematic perspective drawing illustrating the operation of one of the spring biased spring clamp adjustment devices.

DESCRIPTION OF THE PREFERRED EMBODIMENT

Figure 1:
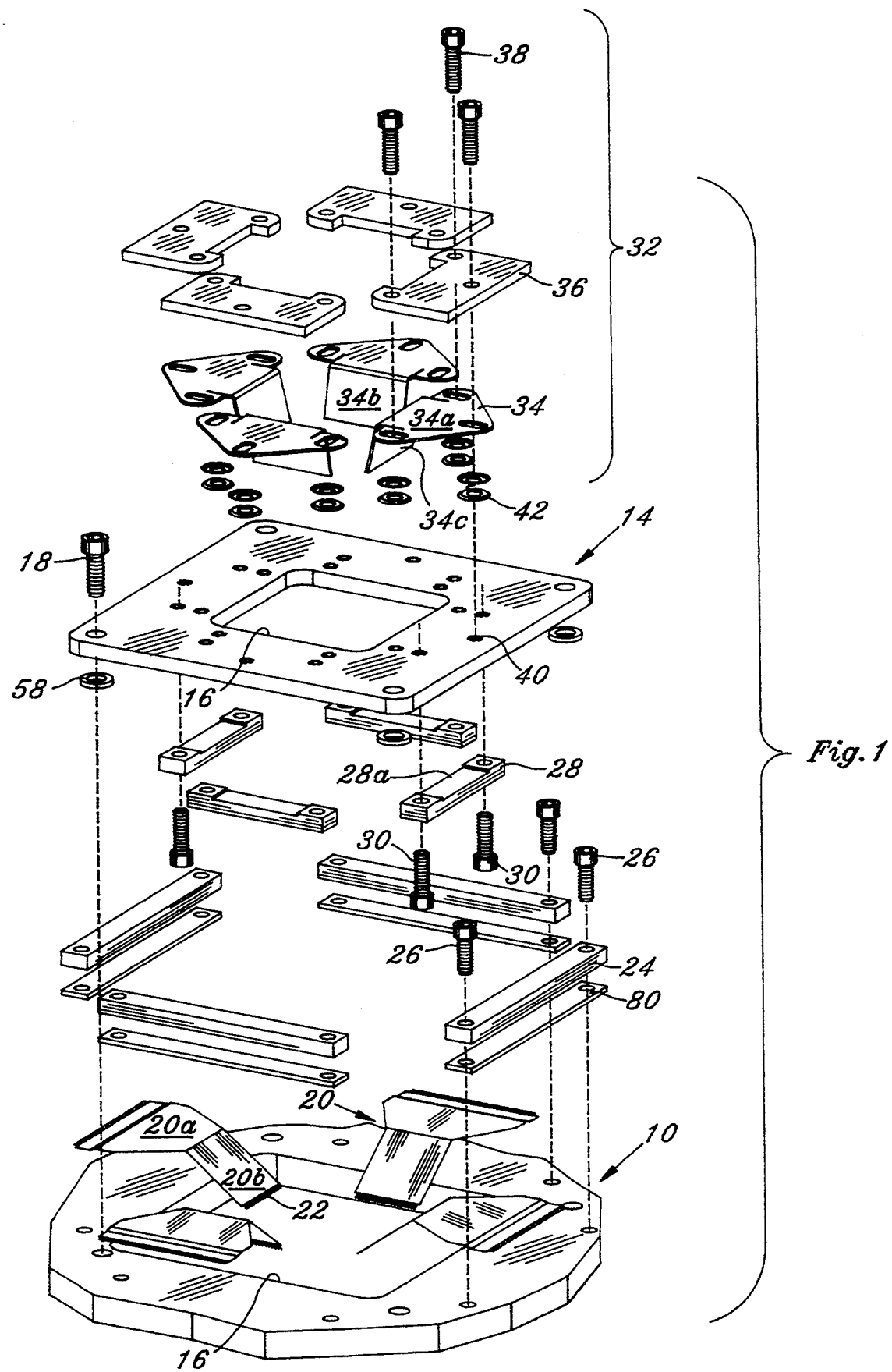
Figure 2:
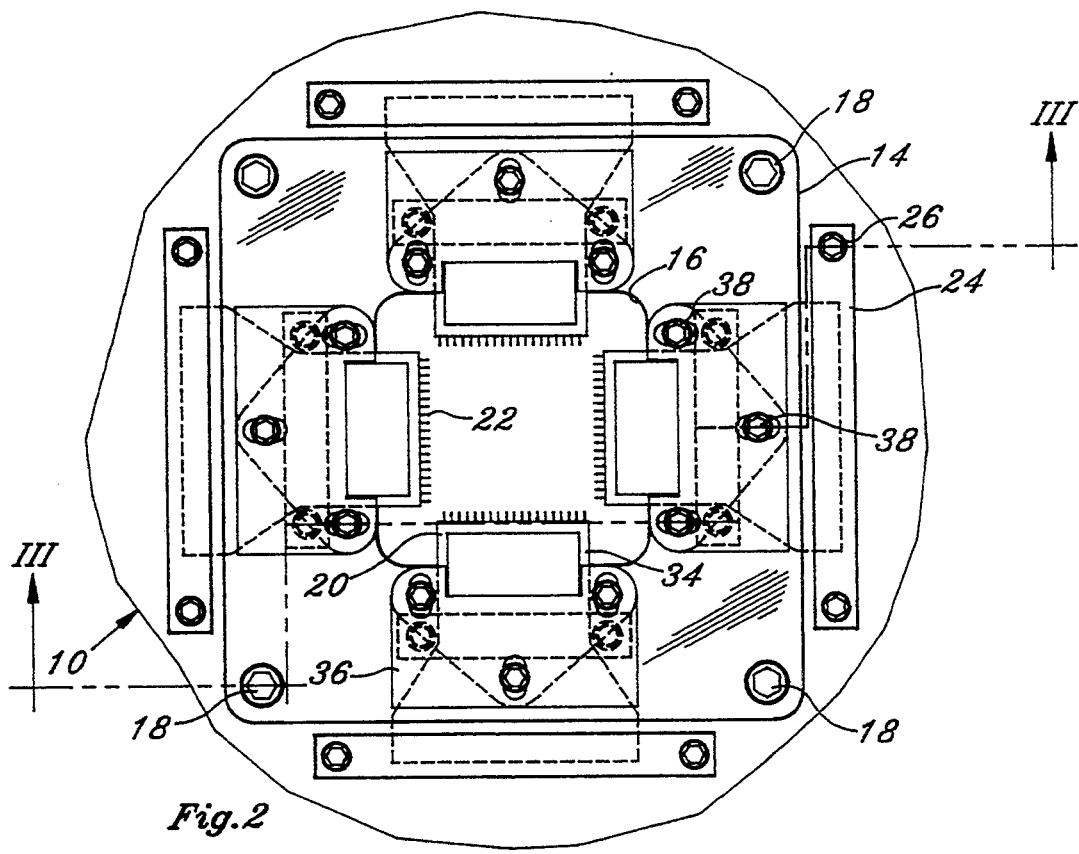
Figure 3:
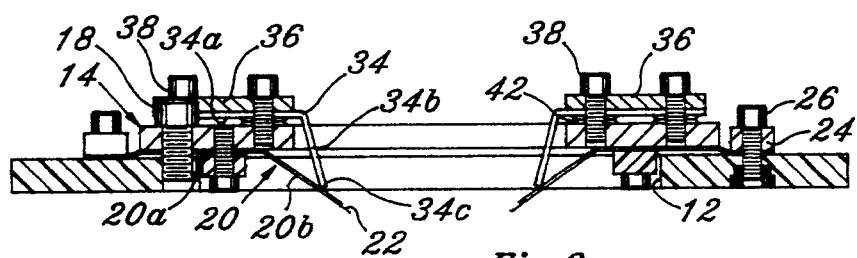

Referring now to the FIG. 1 exploded view of the test probe assembly together with the plan and cross sectional elevation views of FIGS. 2 and 3 respectively, the test probe assembly is illustrated along with its major components and described as follows.

Shown at reference number 10 is the central section of a probe card 10 constructed as an insulated printed circuit board of larger size (not shown) having a square central opening 12.

A frame member 14 with a similar but smaller central opening 16 is arranged to overlap the central opening 12 on the probe card and to be attached thereto by four screws 18 at the frame corners. The upper surface of probe card 10 is provided with a multiplicity of electrically conductive probe card traces (not shown) which have inner terminating ends closely spaced and arranged adjacent the peripheral edges of the central opening 12. The probe card traces radiate from the opening to their opposite outer ends connected to test terminals (not shown) around the outer part of probe card 10, such a construction being well known in the art, and illustrated for example in the aforementioned Evans et al U.S. Pat. No. 4,975,638. Disposed between probe card 10 and frame 14 are four probe wings 20, which are substantially identical in the embodiment shown, but need not be identical, depending upon the arrangement of contact pads on the integrated circuit to be tested. Construction of the probe wings 20 will be further explained in detail, but briefly, they are flexible laminated members constructed to provide electrically conductive probe wing traces on the underside which match at the outer ends of the probe wings with the respective traces on the probe card 10. The inner ends of the probe wing traces extend beyond the end of the laminated section and terminate in a plurality of test probe fingers 22. Probe fingers 22 are extremely closely spaced and correspond to the spacing or pitch of the contact pads in a linear set of contact pads on the IC to be probed.

Each probe wing 20 is clamped to the probe card 10 by an upper wing clamp 24, and resilient pad 80 using two screws 26, so that the respective probe wing traces and probe card traces are individually in physical and electrical contact with one another on probe wing 20 and probe card 10 respectively.

Each probe wing 20 is further supported on the underside of frame 14 by means of a lower insulated wing clamp 28 using two screws 30. Cutout slots 28a are provided to allow some movement of the wings when they are being adjusted or for thermal expansion and contraction. Each probe wing 20, therefore, is securely held between the frame 14 and the probe card 10 by means of a support portion 20a of the probe wing (see FIG. 3). The inner part of the probe wing angles downwardly and has a freely extending leaf spring portion 20b extending into and below the central opening 12 to terminate in probe fingers 22, so that the leaf spring portion 20b is flexibly supported from the frame 14.

In a preferred form of the invention, the tips of probe needles 22 for each of the individual probe wings 20 may be adjusted both in height and in angular orientation with respect to probe card 10 by means of separately adjustable spring clamp assemblies shown generally at reference number 32. An adjustment assembly 32 for each of the probe wings 20 comprises a spring clamp 34, a platform 36, three screws 38 received in threaded holes 40 in the frame, and a set of spring biasing washers 42 for each of the three screws 38. Spring biasing washers 42 are shown as a set of back-to-back Belleville washers, but any spring may be used instead.

Each of the spring clamps 34 comprises a flat triangular support portion 34a and a downwardly extending cantilevered portion 34b terminating in a straight edge 34c. The straight edge 34c is in contact along the upper (ground plane) side of the probe wing flexible leaf spring portion 20b (see FIG. 3). The three sets of spring biasing washers 42 are interposed between the spring clamp support portion 34a and frame 14. Therefore screws 38 may be tightened or loosened to change the orientation of platform 36 and thus vary the restraint exerted by spring clamp 34 on the probe wing 20. The use of three screws permits stable and universal orientation of the platform, as will be well understood in the art. By suitably adjusting screws 38, each of the probe wings 20 may be arranged so that the lines of probe needles on each probe wing are disposed with their tips substantially co-planar with the contact pads on the four respective sides of the integrated circuit to be tested.

Figure 4:
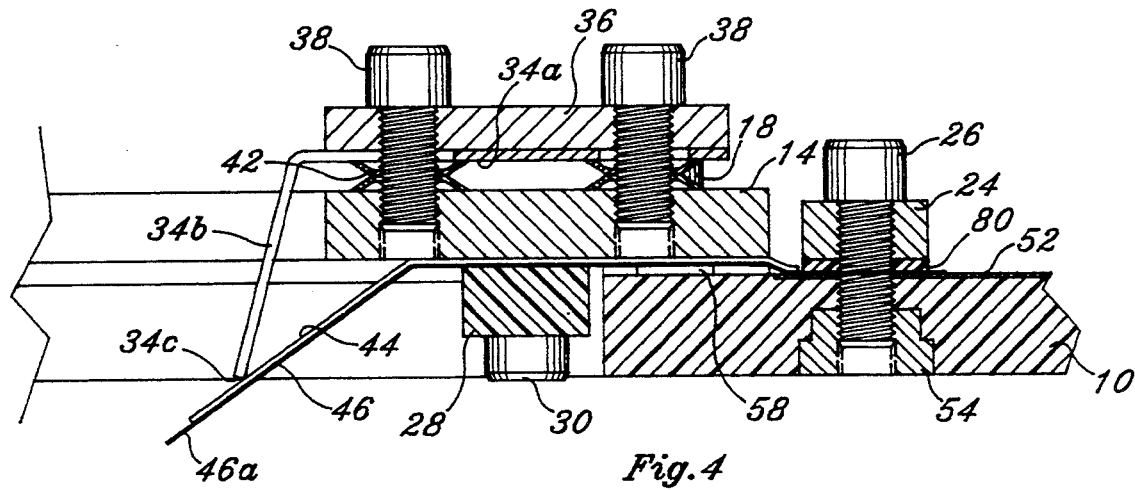

Referring to FIGS. 4, 5, and 6 of the drawing, an enlarged cross section is shown of the adjustable clamping arrangement for a single probe wing 20, as well as plan and elevation views of a probe wing by itself. The probe wing is a laminated member having an upper conductive ply 44 serving as a ground plane, separated by a dielectric adhesive film 45 from a lower conductive metal layer which has been subdivided in a manner to be described to provide individual probe wing traces, such as a trace 46 extending beyond the end of dielectric film 45 and terminating as a probe finger 46a. There are a multiplicity of separate probe wing traces such as traces 48, 50, etc. adjacent trace 46, each of which extends beyond the end of film 45 and terminate as probe fingers 48a, 50a respectively. The tips of probe fingers 46a, 48a, 50a are disposed substantially along a straight line. Probe wing traces 46, 48, 50 fan out and terminate on the other end of the probe wing 20, as shown by reference numbers 46b, 48b, 50b respectively. For the purpose of drawing clarity, the size of traces 46, 48, 50 are enlarged and there are fewer traces shown than would actually be the case.

Referring to FIG. 4 of the drawing, there are corresponding traces 52 on the upper surfaces of test probe card 10 which are spaced to correspond with the spacing of the terminating ends 46b, 48b, 50b. The respective traces are matched and held in electrical contact by the upper wing clamp 24 and resilient pad 80. The latter is secured by screws 26 threaded into PEM nuts 54 embedded in the probe test card 10. The lower wing clamp 28 which supports the underside of the probe wing in the cutout slot 28a below frame 14 is constructed of insulating material to prevent shorting across traces. Frame 14 is spaced off of probe card 10 by means of conductive spacers 58 disposed between the underside of frame 14 and probe card 10 and secured by screws 18. (See also FIG. 1)

Illustrative of a preferred method of manufacturing a typical probe wing 20, reference is made to the drawing of FIGS. 5 and 6. Probe wing 20 is a laminated member having a support portion 20a and a cantilevered leaf spring portion 20b as previously described, the laminated member being flexible in order to adjust the probe finger tips to be co-planar. The thickness of the laminations in FIG. 6 and the width and spacing of traces 46, 48 and 50 in FIG. 5 are greatly exaggerated for the purpose of explanation and clarity of the drawing. In actual practice, there may be four hundred or more contact pads on a large integrated circuit, or one hundred or more on each of the four sides, requiring more than one hundred probe fingers on a probe wing 20. The die pads are typically 0.004 inches square and may be spaced with a pitch of 0.005 inches between pads. The probe fingers, which are produced by etching, are exceedingly fine, about the size of a human hair, a typical probe finger dimension being approximately 0.002 inches (0.05 mm) wide, by 0.0012 inches (0.030 mm) thick, by 0.030 inches (0.76 mm) long. The probe wing is preferably manufactured by the following process.

A laminated member is laid up using two conductive metal plies adhered by an adhesive dielectric film. One metal ply may be a relatively thin (0.0012 inch) copper spring alloy sheet of uniform thickness, preferably beryllium copper. This is coated with the adhesive, which also serves as the dielectric film ply 45 of substantially uniform thickness for establishing proper electrical impedance characteristics with the ground plane. A suitable adhesive is a modified acrylic manufactured by E.

I. dupont de Nemours. The other conductive ply 44 is adhered to the adhesive layer on the first metal ply, the second ply comprising a sheet of 0.006 inch thickness copper spring alloy, preferably beryllium copper which will serve as the ground plane. The first, or thinner metal ply, which will ultimately serve as probe wing traces and probe fingers, is coated with photoresist material, exposed through an extremely precise photonegative using conventional photolithographic techniques to define the trace patterns, and subsequently subjected to an etching process, etching away unwanted metal to remove the metal between traces 46, 48, 50. The etching process will also leave separated probe fingers 22 extending beyond the dielectric film. It is characteristic of the selective etching process to provide rounded points on the fingers. The probe wing is then formed as indicated in FIG. 6 to provide a support portion 20a and an integrally connected leaf spring portion 20b. As shown in the drawings, the ground plane and adhesive film are coextensive over the support portion 20a and over the major portion of the leaf spring portion 20b so as to support the probe fingers near their tips. The length and stiffness of probe fingers 22 is easily varied by arranging the dielectric film and ground plane to end closer to or farther from the probe finger tips during the photolithographic and etching process.

OPERATION

Operation of the invention will be made more readily apparent by reference to FIGS. 7, 8 and 9 of the drawings. FIG. 7 illustrates a partial elevation view showing two probe wings 20 with probe fingers 22 contacting the contact pads 60 of an integrated circuit 62, which has been prepared by conventional manufacturing methods on a silicon wafer 64 containing other integrated circuits. FIG. 8 illustrates a partial plan view at the corner of integrated circuit 62 on wafer 64, together with the corner portions of adjacent integrated circuits 66, 68, 70 all having similar arrangements of contact pads 60. After probe testing, integrated circuits 62, 66, 68, 70 are sliced and separated by conventional methods.

Along each of the four sides of integrated circuit 62, contact pads 20 are disposed in a linear set of uniformly spaced, substantially co-planar pads. Prior to testing, the tips of probe fingers 22 are brought into a common plane together with the tips of probe needles on each of the other three probe wings by use of the spring clamp adjustment assemblies shown in FIG. 9. By tightening or loosening any one of the three screws 38, the pressure plate, together with the support portion of spring clamp 34 is caused to rotate about an axis through the other two screws 38. By this means, the edge 34c of spring clamp 34 can be raised, lowered, twisted or caused to assume various other orientations so as to change the nature of the restraint on the leaf spring portion 20a of probe wing 20, causing it to flex accordingly.

Referring to FIG. 7 of the drawing, the silicon wafer 64 is clamped by vacuum to a computer controlled chuck 72, which is programmed to successively locate integrated circuits precisely in the opening beneath probe wings 20 and to raise the wafer until contact is made with pads 60 and thereafter to raise the IC further to cause the probe fingers and the laminated flexible ends of the probe wing leaf springs to flex cooperatively against the spring clamps and cause a scrubbing action on pads 60 to produce good electrical contact. The additional upward movement after contact, or overdrive, may be on the order of 0.002 to 0.003 inches. Because the probe fingers are on an angle, an overdrive of 0.003 inches can provide a lateral movement on the order of 0.0017 inches of scrub. Thereafter the test probe terminals are connected to electronic instrumentation of the integrated circuit test apparatus to conduct tests on the IC device.

The leaf spring probe wings have resulted in dramatically improved fatigue life of the probe fingers. The etching process will produce slight dimensional variations between probe fingers, but by use of multiple probe fingers projecting from and supported by the laminated member, excellent contact forces can be achieved which are necessary for good scrub of the contact pads and low electrical resistance. Variations in contact pressure along one side of an integrated circuit, or lack of co-planarity at all contact pads on the integrated circuit may be compensated by adjustment of the spring clamps in the manner described previously.

Because the lateral scrub forces take place inwardly in opposite directions (see FIG. 7) on all four sides of the wafer, the lateral forces on the holding chuck are balanced, so that lateral play in the chuck itself is not created by the scrub action. This was not possible with prior art membrane type test probes.

MODIFICATION

Figure 10:
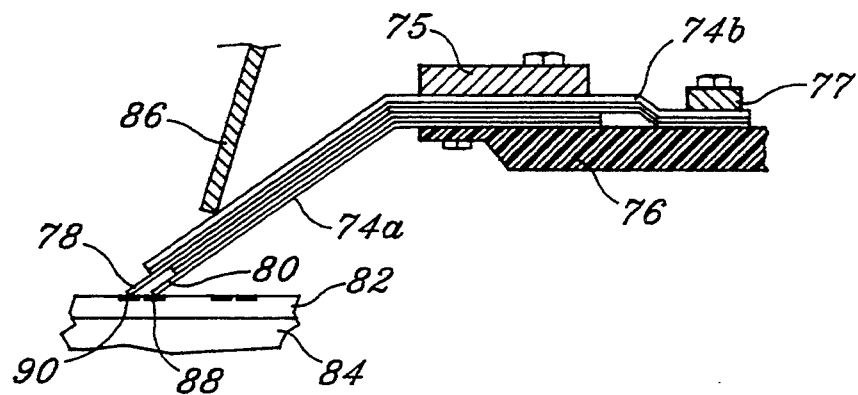
FIG. 10 is a partial side elevational view of a modified form of the invention.
Figure 11:
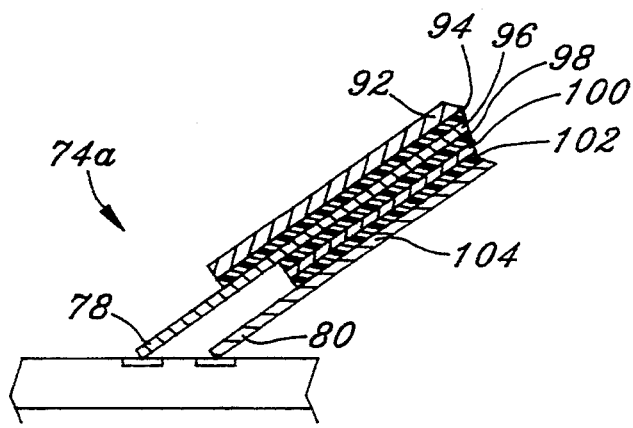
FIG. 11 is an enlarged detail view in cross section of a portion of FIG. 10.
Figure 12:
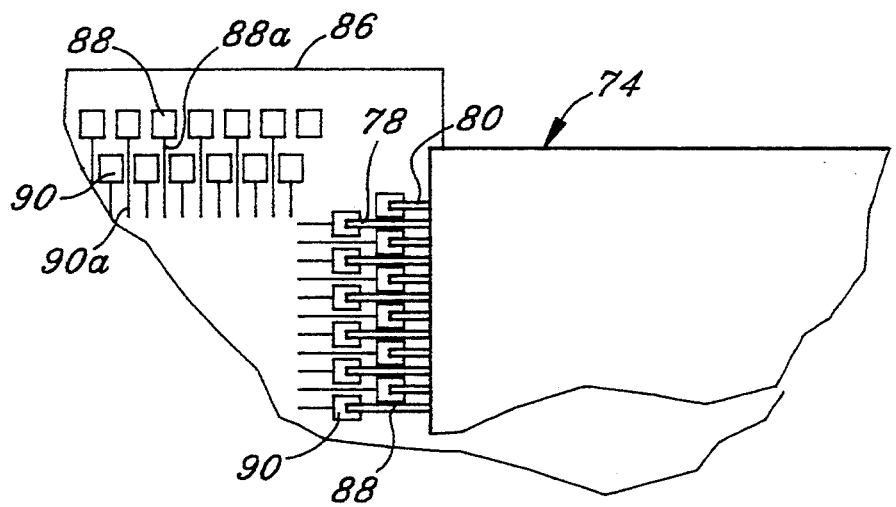
FIG. 12 is a simplified partial top plan view of the modification shown in FIG. 10.

FIGS. 10, 11 and 12 illustrate, in schematic form, a modified form of the invention. There is an ever increasing trend toward higher density of contact pads on integrated circuits. It is physically impractical to achieve any closer spacing (or pitch) of contact pads in a single linear set on one side of an integrated circuit, the present pitch being 0.005 inches for a 0.002 inch square pad, leaving only 0.001 inches clearance between pads. One way to overcome this limitation without increasing the area of the integrated circuit, is to provide two linear sets of contact pads on one or more of the four sides of the integrated circuit—an outer linear set and an inner linear set. In this case, a modified form of the invention for providing a probe assembly to test such an integrated circuit is illustrated in simplified form in FIGS. 10-12. Referring to the elevational view and top plan view respectively of FIGS. 10 and 12, a dual probe wing 74 is shown supported on an insulated probe card 76 by an inner clamp 75 and an outer clamp 77. Dual probe wing 74 is made up of a flexible leaf spring portion 74a and a support portion 74b. Dual probe wing 74 is provided with a first set of probe fingers 78 and a second set of probe fingers 80, which are arranged to probe the upper surface of a silicon wafer 82 when raised by a chuck 84 in the same manner as previously described. An adjustable restraining spring clamp 86 is partially illustrated at its lower end, which is constructed as previously described.

Referring to FIG. 12, it is seen that the silicon wafer includes one or more integrated circuits 86 having an outer linear set of spaced contact pads 88 and an inner linear set of spaced contact pads 90. If the internal leads 88a, 90a are in the same layer within the integrated circuit 86, the pads 88, 90 may be staggered as shown. The first set of probe fingers 78 are similarly staggered with respect to the second set of probe fingers 80, so that they may make contact with the respective contact pads.

Referring to FIG. 11, the enlarged view shows that the dual probe wing 74 is a flexible laminated member, comprising a ground plane conductive metal layer 92, an adhesive dielectric film 94, a layer of electrically separated upper probe wing traces 96, an insulating layer 98, an electrically conductive ground plane layer 100, a dielectric film layer 102, and a conductive metal layer comprising lower probe wing traces 104. The ground plane layers 92, 100 and the probe wing trace layers 96, 104 may be of copper spring alloy, and the insulating layers 94, 98, 102 may be of the previously described modified acrylic. As shown in FIG. 10, the upper probe wing portion (92, 94, 96) extends beyond the lower probe wing portion (100, 102, 104), each being clamped to the probe card by the respective clamps 77, 75 so as to contact the appropriate probe card traces.

Various other modifications can be made without departing from the scope of the invention. For example, probe wings 20 need not be identical, but can be designed with different spacing or finger length to accommodate variations in contact pad layout on an integrated circuit.

Although a ground plane is usually desirable, it is within the scope of the invention to employ the flexible dielectric film with probe wing traces thereon as a test probe without a ground plane layer. In this case the dielectric film and the traces act together as a self-supporting flexible structure.

While the frame member 14 is shown as a single rectangular piece, frame 14 could be manufactured in four separate pieces and attached to the probe card 10. However a single frame provides greater rigidity. Also a frame member may be omitted entirely if the probe wings are separately attached to the underside of the probe card. In this case, the probe card may not require a central opening.

While there has been shown and described what is considered to be the preferred embodiment of the invention, it will be appreciated that other modifications and variations will occur to others skilled in the art, and it is desired to secure in the appended claims all such modifications as fall within the true spirit and scope of the invention.

We claim:

1. A probe assembly for testing an integrated circuit having linear sets of closely spaced substantially co-planar contact pads disposed thereon, said probe assembly comprising:

a probe card of insulating material, said probe card having spaced probe card traces of electrically conductive material thereon arranged for connection to integrated circuit test apparatus, at least one probe wing comprising a flexible laminated member comprising a ground plane sheet of electrically conductive material, a dielectric film of substantially uniform thickness adhered thereto having an end, and a plurality of electrically separate probe wing traces disposed on and adhered to the other side of said dielectric film from said ground plane, said probe wing including a support portion whereon said probe wing traces are spaced to correspond to the spacing of said probe card traces, said probe wing including a leaf spring portion wherein said probe wing traces extend beyond the end of said dielectric film substantially in the plane of said leaf spring portion to terminate in a plurality of separated probe fingers having tips disposed substantially along a straight line and spaced to correspond to the spacing of said contact pads in one of said linear sets, means for attaching said support portion of said probe wing to said probe card with said leaf spring portion extending therefrom, and adjustable means for restraining said leaf spring portion, said adjustable means spaced from said probe finger tips such that said probe fingers remain flexible.

2. The combination according to claim 1, wherein said dielectric film is a modified acrylic material and wherein said probe wing traces are of copper spring alloy.

3. The combination according to claim 1, wherein said probe card defines a central opening, said probe assembly further including a frame removably connected to said probe card adjacent said central opening, said frame being adapted to support four of said probe wings with their respective leaf spring portions extending into said central opening with respective probe finger tips co-planar with one another.

4. The combination according to claim 1, wherein said adjustable means includes a spring clamp adjusting assembly having a spring clamp adapted to contact and exert a selectively adjustable restraint on said leaf spring portion.

5. The combination according to claim 4 wherein said spring clamp adjusting assembly includes a platform adapted to be rotatably adjusted so as to move said spring clamp.

6. The combination according to claim 1, wherein two of said probe wings are superimposed to provide a dual probe wing, said dual probe wing having an additional dielectric film disposed between the said two probe wings and joining them together as a single flexible laminated member.

7. A probe assembly for testing an integrated circuit having linear sets of spaced substantially co-planar contact pads disposed thereon, said probe assembly comprising:

a probe card of insulating material defining a central opening larger than said integrated circuit, said probe card having separate spaced probe card traces arranged and adapted for making temporary test connections to integrated circuit test apparatus, a frame removably connected to said probe card adjacent said central opening, at least one probe wing comprising a flexible laminated member comprising a ground plane sheet of electrically conductive material, a dielectric film of substantially uniform thickness adhered thereto having an end, and a plurality of electrically separate probe wing traces disposed on and adhered to the other side of said dielectric film from said ground plane, said probe wing having a support portion with said probe wing traces spaced to correspond to the spacing of respective probe card traces, said probe wing also having a leaf spring portion extending into said opening and terminating in a plurality of separated probe fingers, said probe fingers being provided by the respective terminating ends of said probe wing traces extending beyond the end of said dielectric film substantially in the plane of said leaf spring portion, said probe fingers having tips disposed substantially along a straight line and spaced to correspond to the spacing of respective contact pads in one of said integrated circuit linear sets of contact pads, at least one spring clamp having an adjustable support portion disposed on said frame and having a cantilevered portion contacting said leaf spring portion of said probe wing at a location spaced from said probe finger tips, so as to provide a restraint for said leaf spring portion where said probe fingers remain flexible, and at least one spring clamp adjusting means for selectively adjusting the restraint exercised by said spring clamp on said leaf spring portion.

8. The combination according to claim 7, wherein said ground plane and said dielectric film are coextensive over the major portion of said leaf spring portion so as to support said probe fingers near the tips thereof.

9. The combination according to claim 7, wherein said dielectric ply is a modified acrylic layer and wherein said probe wing traces are of copper spring alloy.

10. The combination according to claim 7, wherein said spring clamp adjusting means includes a platform attached to said frame and adapted to be rotatably adjusted, said platform being adapted to move said support portion of said spring clamp.

11. The combination according to claim 10, wherein said platform is attached to said frame by three screws and spring biased with respect to said frame.

12. A probe assembly for testing an integrated circuit having linear sets of spaced substantially co-planar contact pads disposed thereon, said probe assembly comprising:

a probe card of insulating material defining a central opening larger than said integrated circuit, said probe card having separate spaced probe card traces arranged and adapted for making temporary test connections to integrated circuit test apparatus, a frame removably connected to said probe card, a plurality of probe wings each comprising a flexible laminated member comprising a ground plane sheet of electrically conductive material, a dielectric film of substantially uniform thickness adhered thereto having an end, and a plurality of electrically separate probe wing traces disposed on and adhered to the other side of said dielectric film from said ground plane, said probe wing having a support portion with said probe wing traces spaced to correspond to the spacing of respective probe card traces, each said probe wing also having an angled leaf spring portion extending into said central opening and terminating in a plurality of separated probe fingers, said probe fingers being provided by the respective terminating ends of said probe wing traces extending beyond the end of said dielectric film substantially in the plane of said leaf spring portion, said probe fingers having tips disposed substantially along a straight line and spaced to correspond to the spacing of respective contact pads in one of said integrated circuit linear sets, a plurality of spring clamps, each having an adjustable support portion disposed on said frame and having a cantilevered portion contacting said leaf spring portion of a respective probe wing at a location spaced from said probe finger tips, so as to provide a restraint for one of said leaf spring portions where said probe fingers remain flexible, and a plurality of spring clamp adjusting means for separately adjusting the restraints exercised by said spring clamps on said leaf spring portions.

13. The combination according to claim 12, wherein there are four each of said probe wings, said spring clamps, and said spring clamp adjusting means.

14. The combination according to claim 12, wherein each said spring clamp adjusting means includes a platform attached to said frame and adapted to be rotatably adjusted, said platform being adapted to move said support portion of said spring clamp.

15. The combination according to claim 14, wherein each said platform is attached to said frame by three screws and spring biased with respect to said frame.

* * * * *